(12) United States Patent
Haringer et al.

(10) Patent No.: US 11,976,379 B2
(45) Date of Patent: May 7, 2024

(54) CRYSTAL PULLING SYSTEMS HAVING FLUID-FILLED EXHAUST TUBES THAT EXTEND THROUGH THE HOUSING

(71) Applicant: GlobalWafers Co., Ltd., Hsinchu (TW)

(72) Inventors: Stephan Haringer, Ciardes (IT); Marco Zardoni, Merano (IT); Mauro Dioda, Bolzano (IT); Hariprasad Sreedharamurthy, Xenia, OH (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 17/496,547

(22) Filed: Oct. 7, 2021

(65) Prior Publication Data

US 2022/0136129 A1 May 5, 2022

Related U.S. Application Data

(60) Provisional application No. 63/109,669, filed on Nov. 4, 2020.

(51) Int. Cl.
*C30B 15/00* (2006.01)
*C30B 15/14* (2006.01)
*C30B 29/06* (2006.01)

(52) U.S. Cl.
CPC ............ *C30B 15/002* (2013.01); *C30B 15/14* (2013.01); *C30B 29/06* (2013.01); *Y10T 117/1032* (2015.01)

(58) Field of Classification Search
CPC ....... C30B 15/00; C30B 15/002; C30B 15/14; C30B 29/06
See application file for complete search history.

(56) References Cited

U.S. PATENT DOCUMENTS

| 3,093,456 A | * | 6/1963 | Ross ..................... C01B 33/037 117/900 |
| 5,891,245 A | * | 4/1999 | Atami ..................... C30B 15/02 117/214 |
| 10,378,121 B2 | | 8/2019 | Dioda et al. | |
| 2017/0145587 A1 | * | 5/2017 | Diodà ..................... C30B 15/00 |

FOREIGN PATENT DOCUMENTS

| CN | 105506730 A | | 4/2016 | |
| CN | 107012501 A | * | 8/2017 | ............ C30B 15/00 |
| CN | 208455104 U | | 2/2019 | |
| CN | 211522363 U | | 9/2020 | |
| JP | 2020152588 A | * | 9/2020 | |
| KR | 2003055900 A | * | 7/2003 | ............ C30B 15/10 |

OTHER PUBLICATIONS

International Search Report and Written Opinion for International Application No. PCT/US2021/057973, 9 pages, dated Feb. 23, 2022.

* cited by examiner

*Primary Examiner* — Hua Qi
(74) *Attorney, Agent, or Firm* — Armstrong Teasdale LLP

(57) ABSTRACT

Crystal pulling systems having a fluid-cooled exhaust tube are disclosed. The fluid-cooled exhaust tube extends through the reactor housing and into the reaction chamber. In some embodiments, the exhaust tube extends through the bottom of the crystal puller housing and through a bottom heat shield within the ingot puller housing.

10 Claims, 7 Drawing Sheets

CRYSTAL PULLING SYSTEMS HAVING FLUID-FILLED EXHAUST TUBES THAT EXTEND THROUGH THE HOUSING

CROSS-REFERENCE TO RELATED APPLICATION

This application claims the benefit of U.S. Provisional Patent Application No. 63/109,669, filed Nov. 4, 2020, which is incorporated herein by reference in its entirety.

FIELD OF THE DISCLOSURE

The field of the disclosure relates to crystal pulling systems for growing a silicon ingot and, in particular, systems that include one or more exhaust tubes that extends through the housing of the crystal pulling system to quick-quench the exhaust gas.

BACKGROUND

Single crystal silicon ingots may be prepared by the so-called Czochralski method in which a single crystal silicon seed is contacted with a silicon melt held within a crucible. The single crystal silicon seed is withdrawn from the melt to pull the single crystal silicon ingot from the melt. The ingot may be prepared in a batch system in which a charge of polycrystalline silicon is initially melted within the crucible and the silicon ingot is withdrawn from the melt until the melted silicon within the crucible is depleted. Alternatively, the ingot may be withdrawn in a continuous Czochralski method in which polysilicon is intermittently or continuously added to the melt to replenish the silicon melt during ingot growth.

Crystal pulling may be performed in the presence of an atmosphere within a housing of the puller. In both batch and continuous Czochralski processes, a process gas inert relative to silicon such as argon is continually introduced into the housing and withdrawn through an exhaust system of the puller. As the process gas is withdrawn, compounds may deposit on the exhaust system tubes (e.g., arsenolite, silicon carbide, and silicon oxide compounds) which is at a lower temperature compared to the puller chamber. Such deposits are removed from the system which may require the puller to be taken out of operation thereby increasing processing cost.

In a continuous Czochralski method, the crystal pulling system operates for longer periods of time. This allows larger and more occlusive deposits to form in the exhaust tube which limits the run time of the system.

A need exists for crystal pulling systems that are characterized by reduced formation of deposits on the exhaust system of the puller.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a crystal pulling system for growing a monocrystalline ingot from a silicon melt. The system includes a housing that defines a growth chamber. The housing has a bottom and a sidewall that extends from the bottom. A crucible is disposed within the growth chamber for containing the silicon melt. An exhaust tube extends through and outward from the bottom of the crucible. The exhaust tube defines an exhaust flow path for discharging an exhaust gas from the growth chamber. The exhaust tube includes an inner wall, an outer wall, and a fluid passage defined between the inner wall and the outer wall for circulating cooling fluid to cool exhaust gas within the exhaust flow path.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
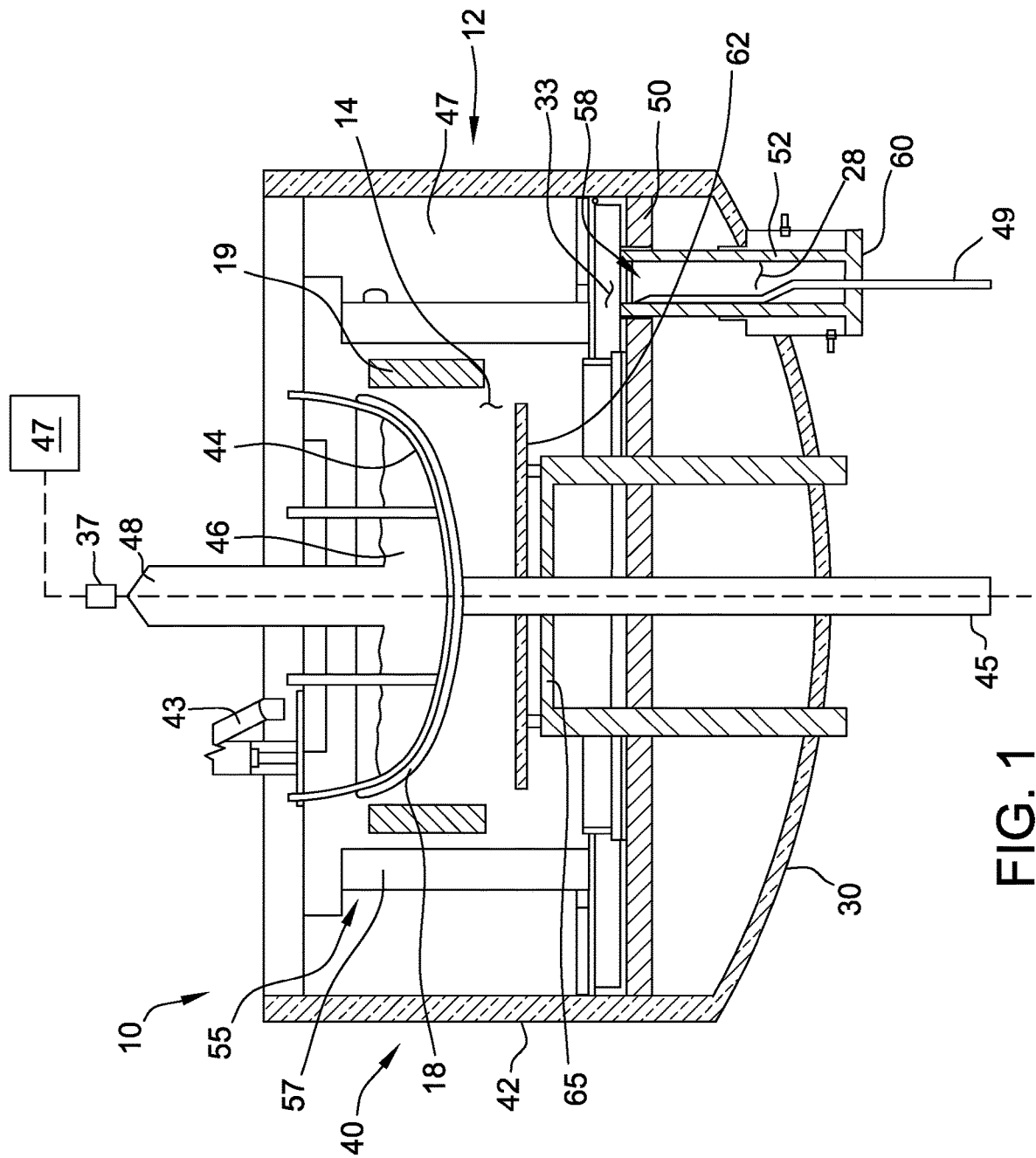
FIG. 1 is a cross-section view of the growth chamber of a crystal pulling system.

Referring to FIG. 1, a crystal pulling system is shown schematically and is indicated generally at 10. FIG. 1 includes the lower portion of the crystal pulling system 10 in which the exhaust gas is removed from the system 10. The system 10 includes an upper portion (not shown) including a pull chamber in which the crystal is pulled and includes pulling mechanism 47 for pulling the ingot 48 from the melt 46.

The crystal pulling system 10 is used to produce monocrystalline (i.e., single crystal) silicon ingots (e.g., semiconductor or solar-grade material) from a silicon melt 46 by the Czochralski (CZ) method. The illustrated crystal pulling system 10 is configured for growing ingots in a continuous CZ method, although the systems and methods disclosed herein may be used to grow monocrystalline ingots by a batch or recharge CZ method.

The illustrated crystal pulling system 10 generally includes a housing 12 defining a growth chamber 14 and an ingot pull chamber (not shown) connected to and positioned above the growth chamber 14. A graphite support or susceptor 18 is supported by a rotatable shaft 45 within the growth chamber 14. A crucible 44 containing a melt 46 of silicon (e.g., semiconductor or solar-grade material) from which a monocrystalline ingot 48 is pulled by a pulling mechanism 47 is supported within the growth chamber 14 by the susceptor 18. A side heater 19 surrounds the susceptor 18 and crucible 44 for supplying thermal energy to the system 10. The system also includes an outer bottom heater 62 and an inner bottom heater 65.

During the crystal growth process, a seed crystal 37 is lowered by the pulling mechanism 47 into contact with the melt 46 and then slowly raised from the melt 46. As the seed crystal 37 is slowly raised from the melt 46, atoms from the melt 46 align themselves with and attach to the seed crystal 37 to form the ingot 48. The system 10 also includes a heat shield (not shown) configured to shield the ingot 48 from radiant heat from the melt 46 to allow the ingot 48 to solidify.

The system includes a feed tube 43 for adding polysilicon to the crucible 44 (i.e., for replenishing polysilicon to the melt 46) as in a continuous Czochralski process. The crystal pulling system 10 also includes a gas inlet (not shown) for introducing an inert gas into the growth chamber 14, and an exhaust outlet 28 for discharging the inert gas and other gaseous and airborne particles from the growth chamber 14. A fluid-cooled exhaust tube 52 extends through the bottom 30 of the housing 12 at the exhaust outlet 28 and extends into the housing 12. The fluid-cooled exhaust tube 52 is configured to rapidly cool exhaust gas discharged from the growth chamber 14 during the Czochralski growth process. As described in more detail herein, the fluid-cooled exhaust tube 52 reduces or prevents build-up of deposits and precipitates within the exhaust tube 52, and thereby facilities longer run times and higher throughput.

The housing 12 includes a lower portion 40 including an annular sidewall 42, an upper dome (not shown) connected to the lower portion 40, and an elongate tubular portion (i.e., pull chamber) extending generally upward from the upper dome. The lower portion 40 of the housing 12 includes a bottom 30 and the annular sidewall 42 extends upward from the bottom 30. The bottom 30 may be rounded as shown or may be straight-sided. The housing 12 may be made of stainless steel or other suitable materials. In some embodiments, a portion of the housing 12 includes fluid-cooled (e.g., water-cooled) stainless steel walls.

The crucible 44 is positioned within the growth chamber 14 such that the ingot 48 can be pulled by the crystal pulling mechanism 47 from the melt 46 within the crucible 44. The crucible 44 may be made of, for example, quartz or any other suitable material that enables the crystal pulling system 10 to function as described herein. Further, the crucible 44 may have any suitable size that enables the crystal pulling system 10 to function as described herein. The system 10 may include a reflector (not shown) positioned to separate the melt 46 from an upper portion of the system 10.

The heaters 19, 62, 65 (e.g., resistance heaters) are operated to melt an initial charge of solid polycrystalline silicon feedstock, and maintain the melt 46 in a liquefied state after the initial charge is melted. The heaters 19, 62, 65 also act to melt solid polycrystalline silicon added through feed tube 43 during growth of the ingot 48. The heaters are arranged at suitable locations about the crucible 44. In the illustrated embodiment, the bottom heaters 62, 65 are positioned beneath the susceptor 18 and crucible 44 and the side heater 19 is positioned radially outward from and extends around the susceptor 18 and crucible 44. In the illustrated embodiment, each heater 19, 62, 65 has a generally annular shape, although the heaters may have any suitable shape that enables the crystal pulling system 10 to function as described herein. In the example embodiment, the heaters 19, 62, 65 are resistive heaters, although the heaters 19, 62, 65 may be any suitable heating device that enables the system 10 to function as described herein. Further, the system 10 may include any suitable number of heaters that enables the system 10 to function as described herein. The crystal pulling system 10 may also include insulation positioned radially outward from and extending around the side heater 19 to prevent heat loss from within the growth chamber 14.

The crystal pulling system 10 may also include a controller communicatively connected to various components of the system 10, such as the rotatable shaft 45 (or a motor connected to the shaft 45) the pulling mechanism 47, and the heaters 19, 62, 65, for controlling operation of such components.

The gas inlet is fluidly connected to a gas supply source. Suitable source gases include, for example and without limitation, inert gases, such as argon, helium, nitrogen, and mixtures thereof. Gas flows generally downward through the growth chamber 14, across a surface of the melt 46, through the exhaust tube 52, through the ingot puller exhaust outlet 28 and through an exhaust tube outlet 60 which is external to the housing 12.

The crystal pulling system 10 includes an inner shell 55 (sometimes referred to in the art as a "heat pack") within the housing 12 within which the heaters 19, 62, 65 and other components of the system 10 may be disposed. The inner shell 55 includes a bottom heat shield 50 and a side heat shield 57 that extends upward from the bottom heat shield 50. The bottom heat shield 50 and side heat shield 57 are disposed within the crystal pulling system housing 12 (i.e., the bottom heat shield 50 being axially inward to the housing bottom 30 and separated by a gap 53 and the side heat shield 57 being radially inward to the housing sidewall 42). The bottom heat shield 50 includes a bottom heat shield exhaust opening 58 through the bottom heat shield 50. The bottom heat shield exhaust opening 58 is generally radially outward to the side heat shield 57 of the inner shell.

Figure 2:
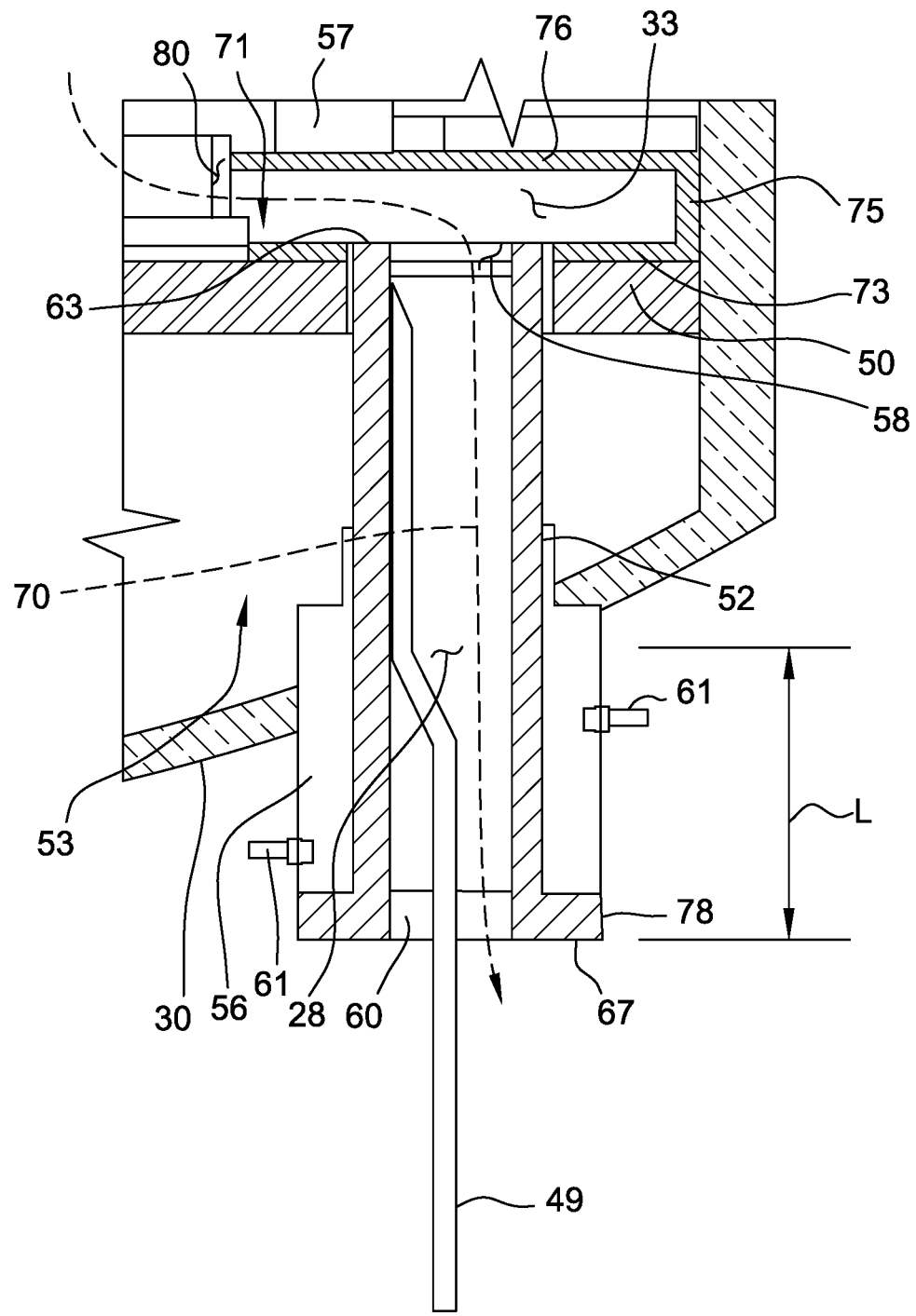
FIG. 2 is a detailed cross-section view of the crystal pulling system showing the exhaust tube.

Referring now to FIG. 2, the crystal pulling system 10 includes an exhaust gas plenum 33 in which exhaust gas is drawn from inside the inner shell 55 and into the exhaust tube 52. The exhaust gas plenum 33 is defined by a plenum housing 71 having a floor 73, top 76 and a sidewall 75 that extends between the floor 73 and top 76. The plenum housing 71 has an inlet 80 through which exhaust gasses pass into the plenum 33. The inlet 80 is radially inward of the side heat shield 57 and is radially outward of the side heater 19 (FIG. 1). As shown in FIG. 2, the exhaust tube 52 extends into the plenum housing floor 73. The plenum 33 directs gases radially outward from within inner shell 55. The plenum 33 extends the entire circumference of the crystal pulling system 10.

The plenum housing 71 may be made of an insulating material and maintains exhaust gas at an elevated temperature prior to reaching the fluid-cooled exhaust tube 52. Suitable materials from which plenum housing 71 may be constructed include, for example and without limitation, carbon such as graphite.

The exhaust tube 52 extends through the bottom heat shield 50 (e.g., through the entire thickness of the bottom heat shield 50) and also through the bottom 30 of the pulling system 10. The plenum inlet 80, the plenum 33, the bottom heat shield exhaust opening 58, exhaust tube 52, ingot puller exhaust outlet 28 of the housing 12, and exhaust tube outlet 60 form an exhaust flow path 70 through which exhaust gasses travel as they are expelled from the system 10. The exhaust tube outlet 60 is fluidly connected with a vacuum pump (not shown). The vacuum pump is configured to create a low pressure or suction at the exhaust tube outlet 60 to remove inert gas, airborne contaminants, and other gaseous products (e.g., SiO, CO) from the growth chamber 14.

In the illustrated embodiment, the system 10 includes a rotatable auger 49 within the exhaust tube 52 which clears deposits from an inner surface of the exhaust tube 52. In other embodiments, the system 10 does not include an auger 49 in the exhaust tube 52.

The exhaust tube 52 extends into the bottom 30 of the housing 12 via a port 56 that extends through the bottom 30. The port 56 may be cooled (e.g., fluid-cooled). The port 56 may have electrical connections 61 for connecting electrical lines with components within the housing 12 (e.g., heaters). The tube 52 may be removably disposed within the port 56. The tube 52 may be connected to the port 56 such as by clamping a flanged portion 78 of the tube 52 between flanges (not shown) of the port 56 and puller exhaust tubing or may be connected to the port 56 by other suitable methods. In other embodiments, the tube 52 is fixedly connected to the bottom 30 of the system 10. In some embodiments, the system 10 does not include felt insulation that surrounds the exhaust tube 52.

The exhaust tube 52 includes a first end 63 that is co-planar with the floor 73 of the gas plenum housing 71. The exhaust tube 52 is connected to the bottom 30 of the ingot puller housing 12. The exhaust tube 52 includes a second, distal end 67 that includes a flanged portion 78 for connection to a vacuum system.

Figure 3:
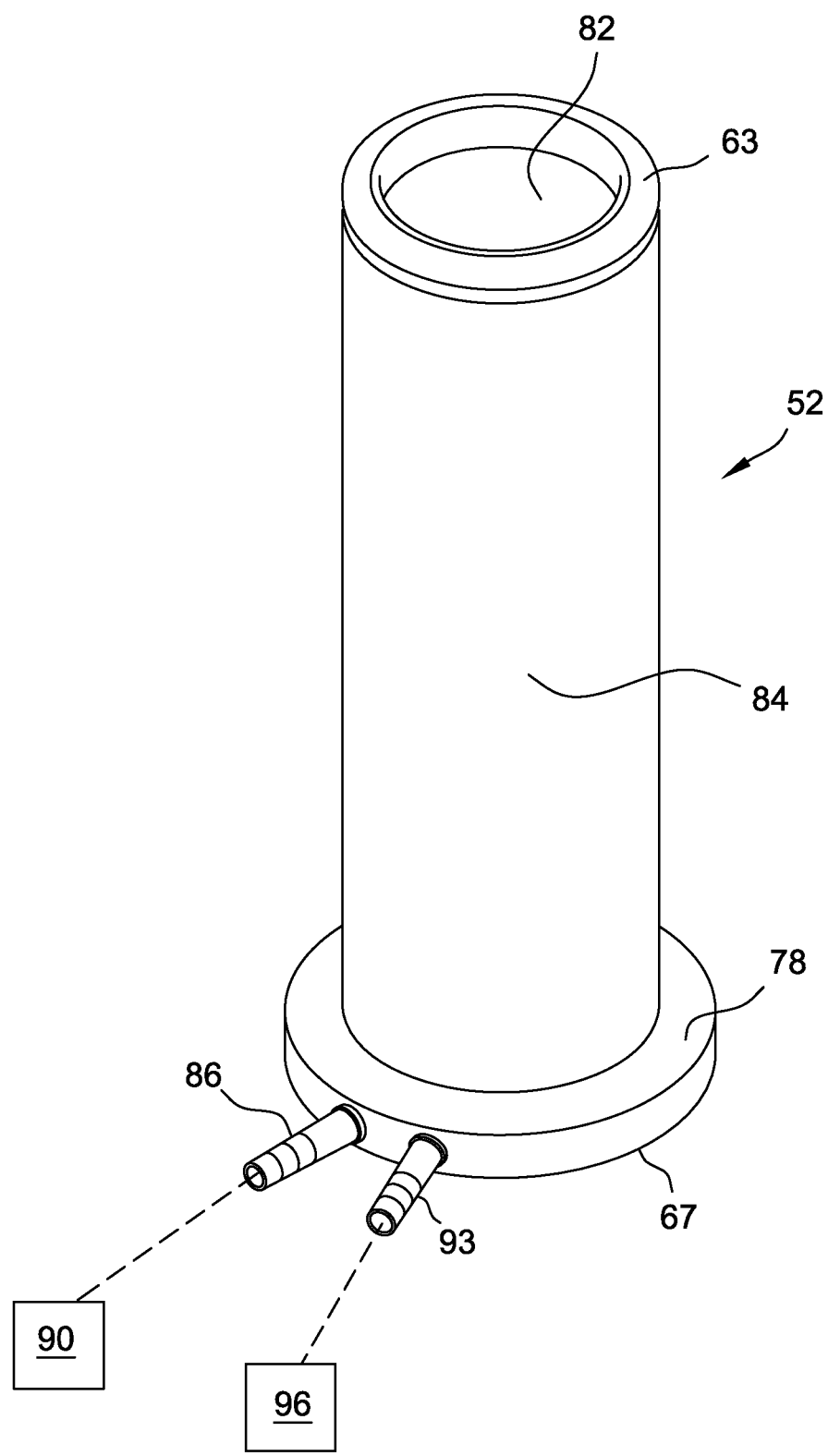
FIG. 3 is a perspective view of the exhaust tube.
Figure 4:
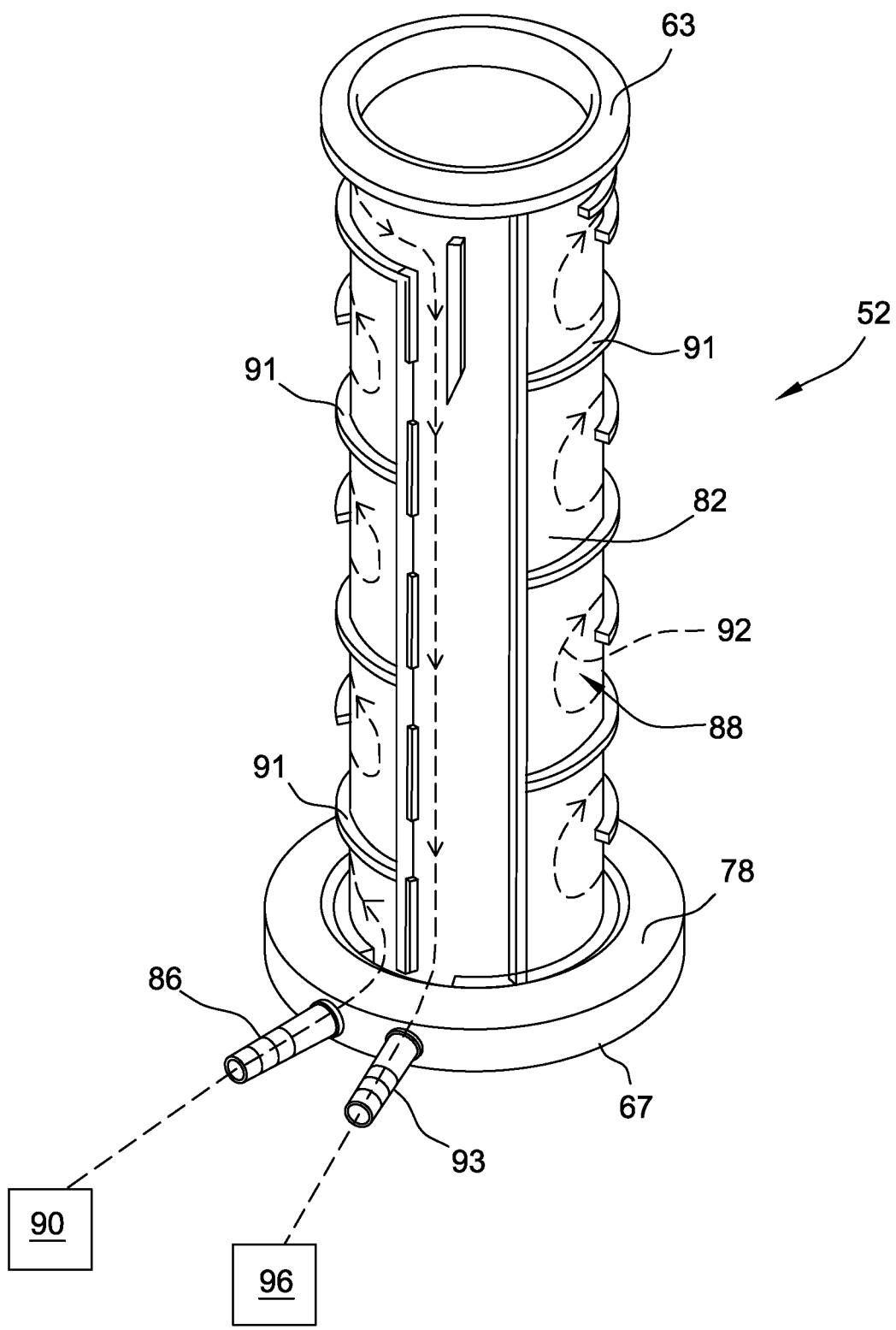
FIG. 4 is a perspective view of the inner wall and baffles of the exhaust tube.

Referring now to FIGS. 3-4, the exhaust tube 52 includes a radial inner wall 82 and a radial outer wall 84 each extending from the first end 63 to the second end 67. The exhaust tube 52 includes baffles 91 between the inner wall 82 and outer wall 84. The inner wall 82, outer wall 84 and baffles 91 define a flow channel 88. The flow channel 88 defines a flow path 92 along which fluid circulates within the exhaust tube 52. The fluid channel 88 is configured to receive fluid, such as water, for cooling exhaust gas within the exhaust flow path 70. Cooling fluid generally moves upward toward the first end 63 of the tube 52 and back down toward the second end 67. The fluid that circulates within the fluid channel 88 may be water which may be at a temperature significantly less than the hot zone of the puller (e.g., 30° C. to 40° C. compared to about 1700° C. or more).

The inner wall 82 of the exhaust tube 52 is constructed of suitable thermally conductive materials to facilitate heat exchange between the cooling fluid and exhaust gas within the exhaust flow path 70. Suitable materials from which the inner wall 82 may be constructed include, for example and without limitation, stainless steel. In some embodiments, the inner wall 82 is constructed of the same materials as the housing 12. The outer wall 84 and/or baffles 91 may be constructed of the same materials as the inner wall 82, or may be constructed of materials different than the inner wall 82.

The fluid channel 88 is fluidly connected with a fluid supply source 90 at a fluid supply inlet 86 for supplying cooling fluid to the fluid channel 88. The cooling fluid may be any suitable fluid that enables the system 10 to function as described herein, including, for example and without limitation, water and any cooling fluid (e.g., refrigerated water or ethylene glycol). The flow rate of cooling fluid through the fluid channel 88 may be controlled to increase or decrease the cooling rate of exhaust gas within the exhaust flow path. In some embodiments, the flow rate of the cooling fluid through the first fluid channel 88 is between about 5 liters per minute (L/min) and about 60 L/min, and, more suitably, is about 40 L/min. The fluid supply source 90 may be connected to suitable flow control components, such as pumps and flow controllers (not shown) for controlling the flow rate of fluid through the fluid channel 88.

From the fluid supply source 90, the cooling fluid moves through the inlet 86 and into the fluid channel 88. The cooling fluid travels around the baffles 91 and along the flow path 92. The cooling fluid moves toward the first end 63 of the tube 52 within the fluid channel and then travels back down the tube toward the second end 67 and the fluid supply outlet 93. The cooling fluid moves through the fluid supply outlet 93 and enters a cooling fluid treatment system 96 (e.g., cooling and disposal or recycle).

In the illustrated embodiment, the cooling fluid inlet 86 and outlet 93 are fluidly connected to the exhaust tube 52 at the flange portion 78 of the exhaust tube 52. The inlets 86 and outlets 93 may be disposed at other positions along the tube 52 that allow the exhaust tube 52 to function as described herein.

As shown in FIG. 2, the exhaust tube 52 extends a length L below the bottom 30 of the housing 12. In the illustrated embodiment, the exhaust tube 52 is fluid-cooled over the entire length L, although in other embodiments, the exhaust tube 52 may be fluid-cooled over only a portion of the length L.

In the embodiment shown in FIG. 1, the crystal pulling system 10 includes a single exhaust tube 52 and port 56. In other embodiments, the system includes two, three or more exhaust tubes 52 and ports 56 (e.g., three exhaust tubes 52 and ports 56 which are symmetrically spaced about the crystal pulling system bottom 30).

The crystal pulling system 10 is suitably used to grow monocrystalline ingots from the melt 46 according to the Czochralski method. More specifically, a melt 46 is prepared in the crucible 44 by charging the crucible 44 with polycrystalline silicon feedstock material. The feedstock material is melted in the crucible 44 using heaters 19, 62, 65 to form the melt 46 of semiconductor or solar-grade material. Once the feedstock material is sufficiently melted, the seed crystal 37 is lowered into contact with the melt 46 by the pulling mechanism 47 to initiate crystal growth, and a monocrystalline ingot 48 is grown from the melt 46 by subsequently pulling the seed crystal 37 away from the melt 46. Polysilicon is continuously or intermittently added to the crucible 44 via the feed tube 43 to allow the ingot 48 to be continuously grown.

During the growth process, inert gas, such as argon, is introduced into the growth chamber 14 through the gas inlet, and is directed generally downward, along the surface of the melt 46 and to the inlet 80 of the plenum 33. The exhaust gas moves through the plenum 33, the bottom heat shield exhaust opening 58, exhaust tube 52, ingot puller exhaust outlet 28, and through the exhaust tube outlet 60. The vacuum system establishes a negative or reduced pressure at the exhaust tube outlet 60 to draw exhaust gas (e.g., inert gas and gaseous species generated by the melt 46 and/or other components of the system 10) out of the growth chamber 14 through the exhaust flow path 70.

As the exhaust gas flows through the exhaust flow path 70, the fluid-cooled exhaust tube 52 cools the exhaust gas relatively rapidly. In particular, a cooling fluid is directed through the fluid channel 88 defined by the inner wall 82, the outer wall 84 and baffles 91 of the exhaust tube 52 to cause a heat exchange between the exhaust gas and the cooling fluid.

Without being bound by any particular theory, it is believed that rapidly cooling the exhaust gas, as opposed to maintaining exhaust gas at an elevated temperature, results in the formation of precipitates (e.g., arsenolite, silicon carbide and silicon oxides ($Si_xO_y$)) having a powder-like structure or morphology that does not adhere to inner surfaces of the exhaust tube 52 as strongly as precipitates formed at higher temperatures (e.g., near a condensation or precipitation temperature). As a result, precipitates formed within the fluid-cooled exhaust tube 52 have a reduced tendency to aggregate or build-up within the exhaust flow path 70, allowing crystal growth processes to be carried out for extended periods of time.

The crystal pulling systems described herein provide several advantages over conventional crystal pulling systems. By extending the water-cooled exhaust tube into the reaction chamber (e.g., through the bottom of the puller, through the bottom heat shield and/or through the exhaust gas plenum housing), the gas near the hot zone of the puller is quench cooled. This creates a relatively high temperature gradient once the gases are removed from the hot zone and the gaseous compounds condense in the gas stream and form less deposits on the tube walls. Quench cooling also changes the morphology of the condensed particles from hard solid layers to a powder-like structure less likely to adhere to the exhaust tube inner wall. As a result, precipitates formed within the fluid-cooled exhaust tubes of the present disclosure have a reduced tendency to aggregate or build-up within the exhaust flow path, allowing crystal growth processes to be carried out for extended periods of time. In embodiments in which the exhaust gas is pulled radially inward from a side heat shield (e.g., through an exhaust gas plenum) and travels through the exhaust tube which is radially outward from the side heat shield, the gases may be maintained at a higher temperature before quench cooling (e.g., the flow path distance until quench cooling is reduced).

EXAMPLES

The processes of the present disclosure are further illustrated by the following Examples. These Examples should not be viewed in a limiting sense.

Figure 5:
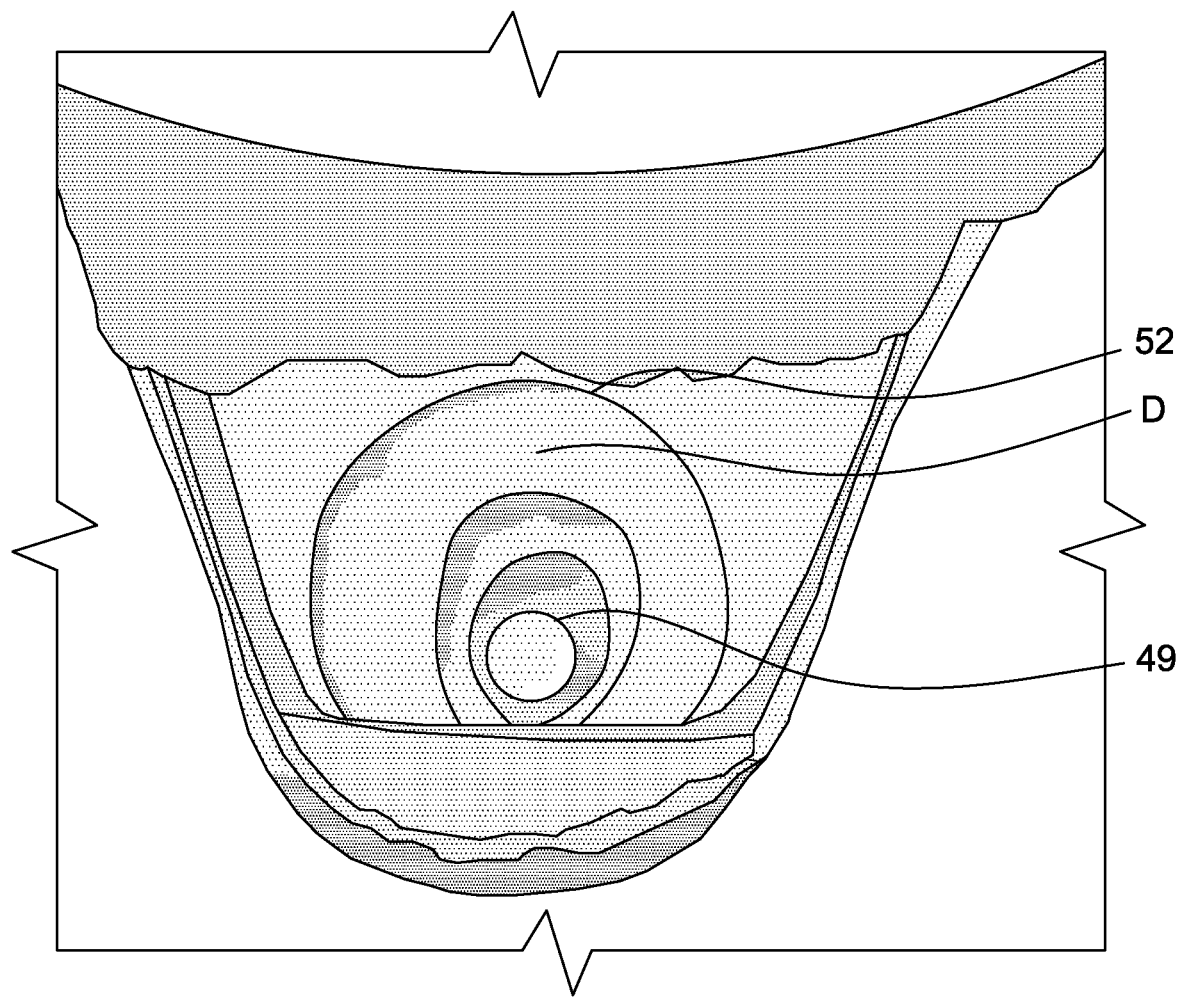
FIG. 5 is a reproduction of a photo of an exhaust tube that was not fluid-cooled and did not extend into the reaction chamber of a crystal pulling system.

Example 1: Effect of Using an Fluid-Cooled Exhaust Tube that Extends into the Reaction Chamber FIG. 5 shows occlusions in a conventional exhaust tube 52 (i.e., non-fluid cooled which does not extend into the reaction chamber (e.g., through the bottom of the housing). The ingot puller system was operated in a continuous Czochralski pulling process in which polycrystalline silicon was added to the melt during ingot growth. The exhaust tube was composed of stainless steel and did not include a cooling-fluid channel formed therein. As shown in FIG. 5, the exhaust tube 52 was fully occluded with deposits D and the exhaust gas was unable to pass through the tube 52. An auger 49 within the exhaust tube 52 was powered but was not able to remove the deposits. The reactor was shut-down to clear the deposits.

Figure 6:
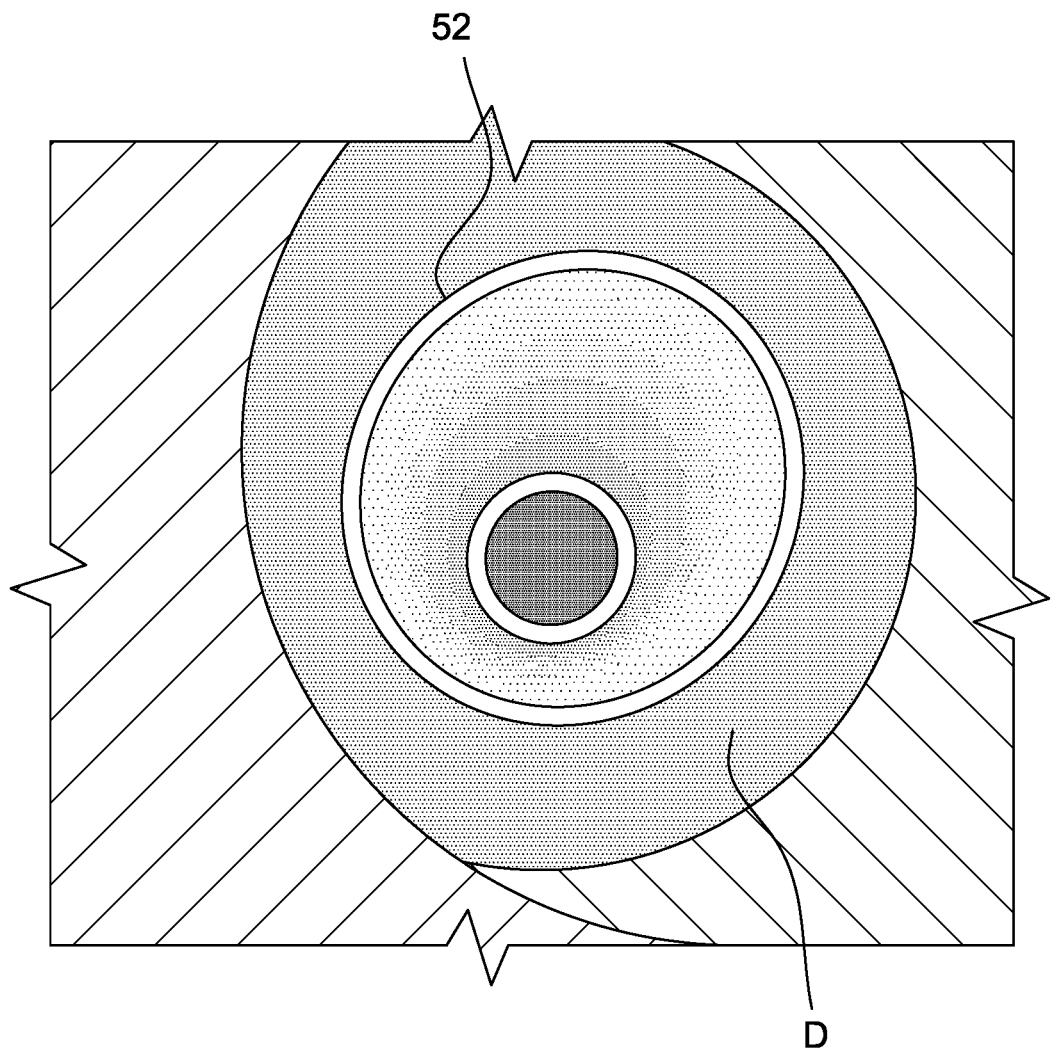
FIG. 6 is a reproduction of a photo of an exhaust tube that was fluid-cooled and extended into the reaction chamber of a crystal pulling system.

FIG. 6 shows an exhaust tube 52 which was water cooled and extended into the reaction chamber to the extent shown in FIG. 1. The deposits D were more powder-like and where white-orange in color. The system of FIG. 6 did not include an auger. As may be seen from the Figures, use of a fluid-cooled exhaust tube which extended into the reactor chamber nearer the hot zone significantly reduced deposits on the exhaust tube.

Figure 7:
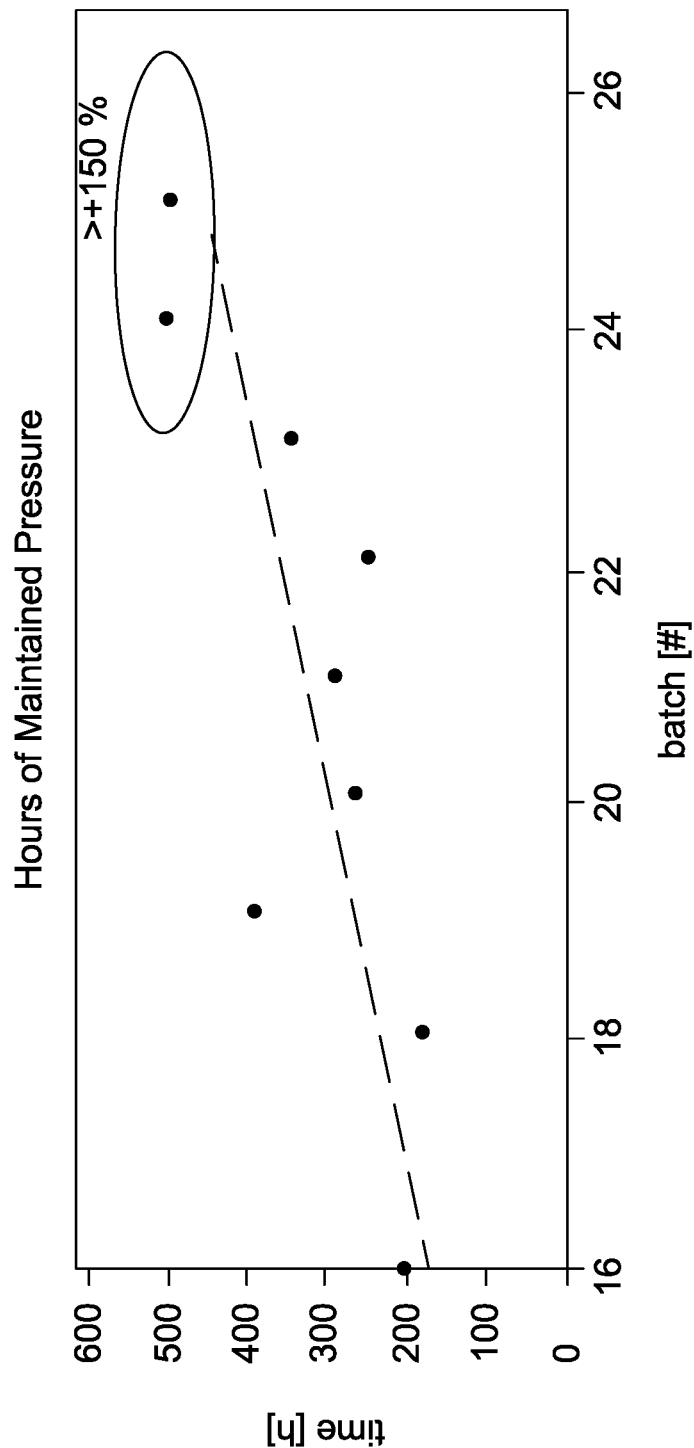
FIG. 7 is a graph of the run time between crystal pulling systems having an exhaust tube that was not fluid-cooled and did not extend into the reaction chamber and crystal pulling systems having an exhaust tube that was fluid-cooled and extended into the reaction chamber.

Example 2: Effect of Using an Fluid-Cooled Exhaust Tube that Extends into the Reaction Chamber FIG. 7 shows the run time before clogging of the exhaust tube for crystal puller systems in which the exhaust tube is not fluid-cooled and does not extend into the reaction chamber. FIG. 7 also shows the run-time before clogging of the exhaust tube for crystal puller systems (circled batches) having an exhaust tube that is fluid-cooled and that extends into the reaction chamber as shown in FIG. 1. As shown in FIG. 7, the run time increased by 150% or more for the batches. This was the case for even more heavily doped processes which conventionally increase exhaust tube deposits. This allows more ingots to be grown in the puller before the pressure rises.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:
1. A crystal pulling system for growing a monocrystalline ingot from a silicon melt, the system comprising:
    a crystal pulling system housing defining a growth chamber, the crystal pulling system housing having a bottom and a sidewall that extends from the bottom;
    a bottom heat shield disposed above the bottom of the crystal pulling system housing, the bottom of the crystal pulling system housing and the bottom heat shield being separated by a gap;
    a crucible disposed within the growth chamber for containing the silicon melt;
    an exhaust tube that extends through and outward from the bottom of the crystal pulling system housing, the exhaust tube defining an exhaust flow path for discharging an exhaust gas from the growth chamber, the exhaust tube comprising:
        an inner wall;
        an outer wall; and
        a fluid channel defined between the inner wall and the outer wall for circulating cooling fluid to cool the exhaust gas within the exhaust flow path, the fluid channel extending through the bottom of the crystal pulling system housing and at least to the bottom heat shield.

2. The crystal pulling system as set forth in claim 1 comprising an exhaust gas plenum, the exhaust gas plenum comprising a plenum housing, the plenum housing comprising a floor, top and a sidewall that extends between the floor and top, wherein the exhaust tube extends into the plenum housing floor.

3. The crystal pulling system as set forth in claim 2 wherein the plenum housing is made of insulation.

4. The crystal pulling system as set forth in claim 2 wherein the exhaust gas plenum has an inlet, the inlet being disposed radially inward to a side heat shield disposed above the bottom heat shield, the side heat shield being radially inward to the sidewall of the plenum housing.

5. The crystal pulling system as set forth in claim 4 comprising a side heater that surrounds the crucible, the inlet of the exhaust gas plenum being disposed radially outward to the side heater.

6. The crystal pulling system as set forth in claim 1 comprising a vacuum pump fluidly connected with the exhaust tube to draw the exhaust gas through the exhaust flow path.

7. The crystal pulling system as set forth in claim 1 wherein a portion of the exhaust tube extends downward from the bottom of the crystal pulling system housing, the portion being fluid cooled.

8. The crystal pulling system as set forth in claim 1 comprising a rotatable auger within the exhaust tube which clears deposits from an inner surface of the exhaust tube.

9. The crystal pulling system as set forth in claim 1 further comprising a feed tube for adding polysilicon to the crucible.

10. The crystal pulling system as set forth in claim 1 wherein the exhaust tube comprises baffles disposed between the inner wall and the outer wall, the fluid channel being defined between the inner wall, the outer wall and the baffles.

* * * * *